United States Patent [19]
Yamamoto

[11] Patent Number: 6,100,625
[45] Date of Patent: Aug. 8, 2000

[54] PIEZOELECTRIC CERAMIC TRANSDUCER AND METHOD OF FORMING THE SAME

[75] Inventor: Mitsuru Yamamoto, Tokyo, Japan

[73] Assignee: NEC Corporation, Tokyo, Japan

[21] Appl. No.: 09/188,379

[22] Filed: Nov. 10, 1998

[30] Foreign Application Priority Data

Nov. 10, 1997 [JP] Japan .................................... 9-307711

[51] Int. Cl.⁷ .................................................. H01L 41/08
[52] U.S. Cl. ........................... 310/328; 310/354; 310/366
[58] Field of Search .................................. 310/328, 358, 310/359, 366, 367, 368

[56] References Cited

U.S. PATENT DOCUMENTS

| | | | |
|---|---|---|---|
| 3,489,931 | 1/1970 | Teaford | 310/328 X |
| 4,876,476 | 10/1989 | Kittaka et al. | 310/320 |
| 5,118,982 | 6/1992 | Inoue et al. | 310/366 |
| 5,153,477 | 10/1992 | Jomura et al. | 310/328 |
| 5,163,209 | 11/1992 | Harada et al. | 310/328 X |
| 5,241,236 | 8/1993 | Sasaki et al. | 310/358 |
| 5,367,500 | 11/1994 | Ng | 310/328 X |
| 6,004,644 | 12/1999 | Takeuchi et al. | 310/328 X |

*Primary Examiner*—Mark O. Budd
*Attorney, Agent, or Firm*—Young & Thompson

[57] ABSTRACT

The present invention provides a piezoelectric ceramic transducer having at least a driver section, at least a power generator section and at least an isolator which isolates the driver section and the power generator section, wherein the isolator comprises an internal space as a gap.

7 Claims, 7 Drawing Sheets

PIEZOELECTRIC CERAMIC TRANSDUCER AND METHOD OF FORMING THE SAME

BACKGROUND OF THE INVENTION

The present invention relates to a piezoelectric ceramic transducer and a method of forming the same, and more particularly to a piezoelectric ceramic transducer for a compact size power circuit capable of a highly efficient power transmission.

A piezoelectric ceramic transducer for a power circuit comprises a driver section positioned in a primary side for receiving an alternating-current voltage and a power generator section having an output electrode, wherein the driver section and the power generator section are isolated by an insulation layer from each other. A first conventional piezoelectric ceramic transducer is disclosed in Japanese laid-open patent publication No. 5-206539. A second conventional piezoelectric ceramic transducer is disclosed in Japanese laid-open patent publication No. 5- 235434. A third conventional piezoelectric ceramic transducer is disclosed in Japanese laid-open patent publication No. 6-54686.

FIG. 1 is a schematic perspective view illustrative of the first conventional piezoelectric ceramic transducer which utilizes a vertical vibration in a thickness direction which is vertical to interfaces of laminated layers. The first conventional piezoelectric ceramic transducer has a first driver section 51, a second driver section 51' and a power generator section 52. The first driver section 51 and the second driver section 51' are separated by a first insulator 55. The second driver section 51' and the power generator section 52 are separated by a second insulator 55'. The first driver section 51 comprises laminations of multiple piezoelectric ceramic layers 56 which are polarized in a thickness direction and which are separated by internal electrodes 53 from each other. The second driver section 51' also comprises laminations of multiple piezoelectric ceramic layers 56' which are polarized in a thickness direction and which are separated by internal electrodes 53' from each other. The power generator section 52 comprises a single piezoelectric ceramic layer 57. Unpolarized piezoelectric ceramic layers are provided in the first and second insulators 55 and 55', so that each of the first and second insulators 55 and 55' is sintered to integrate the unpolarized piezoelectric ceramic layer. The unpolarized piezoelectric ceramic layer may be replaced by an insulating plate of other material than the unpolarized piezoelectric ceramic as a modification.

FIG. 2 is a schematic perspective view illustrative of the second conventional piezoelectric ceramic transducer which utilizes a vertical vibration in a thickness direction which is vertical to interfaces of laminated layers. The second conventional piezoelectric ceramic transducer has a driver section 61 and a power generator 62. The driver section 61 and the power generator section 62 are separated by an insulator 65. The driver section 61 comprises laminations of multiple piezoelectric ceramic layers 66 which are polarized in a thickness direction and which are separated by internal electrodes 66 from each other. The power generator section 62 comprises a single piezoelectric ceramic layer 68. An unpolarized piezoelectric ceramic layer is provided in the insulator 65, so that the insulator 65 is sintered to integrate the unpolarized piezoelectric ceramic layer. The unpolarized piezoelectric ceramic layer may be replaced by an insulating plate of other material than the unpolarized piezoelectric ceramic as a modification.

FIG. 3 is a schematic perspective view illustrative of the third conventional piezoelectric ceramic transducer. The third conventional piezoelectric ceramic transducer has a driver section 71 and a power generator section 72 which are separated by a dielectric plate 70 from each other. The driver section 71 has an electrode comprising a main electrode 74 and a feedback electrode 76 which are separated from each other. The feedback electrode 76 is connected to an input side of a power amplifier 77, whilst the main electrode 74 is connected to an output side of the power amplifier 77. The driver section 71 shows an automatic oscillation in an X-direction to convert electric signals into mechanical signals. The oscillation of the driver section 71 is transmitted through the dielectric plate 70 to the power generator section 72 so that the power generator 72 converts the transmitted mechanical signals into electric signals which are then output from output terminals 78 and 79.

The above conventional piezoelectric ceramic transducers have the insulators comprising the piezoelectric ceramic plates which are made of the same materials as the driver section or the power generator section, for which reason it is required that the insulators have a sufficient thickness for insulating the driver section and the power generator section. This makes it difficult to reduce the size of the piezoelectric ceramic transducers. This issue is common to the other piezoelectric transducers made of the other materials than ceramic.

Further, the above conventional piezoelectric ceramic transducers use the piezoelectric ceramic materials for the insulators, for which reason it is required that the insulators have a sufficient thickness for preventing dangers such as an electric shock.

Since, further, the insulators are designed to transmit the vibration, there is raised a further problem with a large noise.

In the above circumstances, it had been required to develop a novel piezoelectric ceramic transducer which is free from the above problems.

SUMMARY OF THE INVENTION

Accordingly, it is an object of the present invention to provide a novel piezoelectric ceramic transducer free from the above problems.

It is a further object of the present invention to provide a novel piezoelectric ceramic transducer which is suitable for size reduction.

It is a still further object of the present invention to provide a novel piezoelectric ceramic transducer having insulators having a reduced thickness.

It is yet a further object of the present invention to provide a novel piezoelectric ceramic transducer which is safety.

It is a further more object of the present invention to provide a novel piezoelectric ceramic transducer free from any large noise.

It is still more object of the present invention to provide a novel piezoelectric ceramic transducer which exhibits highly efficient conversion operations.

It is moreover object of the present invention to provide a novel method of forming a piezoelectric ceramic transducer free from the above problems.

It is another object of the present invention to provide a novel method of forming a novel piezoelectric ceramic transducer which is suitable for size reduction.

It is still another object of the present invention to provide a novel method of forming a novel piezoelectric ceramic transducer having insulators having a reduced thickness.

It is yet another object of the present invention to provide a novel method of forming a novel piezoelectric ceramic transducer which is safety.

It is further another object of the present invention to provide a novel method of forming a novel piezoelectric ceramic transducer free from any large noise.

It is an additional object of the present invention to provide a novel method of forming a novel piezoelectric ceramic transducer which exhibits highly efficient conversion operations.

The present invention provides a piezoelectric ceramic transducer having at least a driver section, at least a power generator section and at least an isolator which isolates the driver section and the power generator section, wherein the isolator comprises an internal space as a gap.

The insulation air gap has a high insulating property so that even if the insulation air gap is formed very thin for size reduction of the transducer, then the insulation air gap has a sufficiently high insulating property. Further, the insulation air gap is capable of preventing a transmission of the mechanical vibration whereby the insulation air gap realizes the highly efficient and noise free transducer.

The above and other objects, features and advantages of the present invention will be apparent from the following descriptions.

BRIEF DESCRIPTION OF THE DRAWINGS

Preferred embodiments according to the present invention will be described in detail with references to the accompanying drawings.

DISCLOSURE OF THE INVENTION

Figure 1:
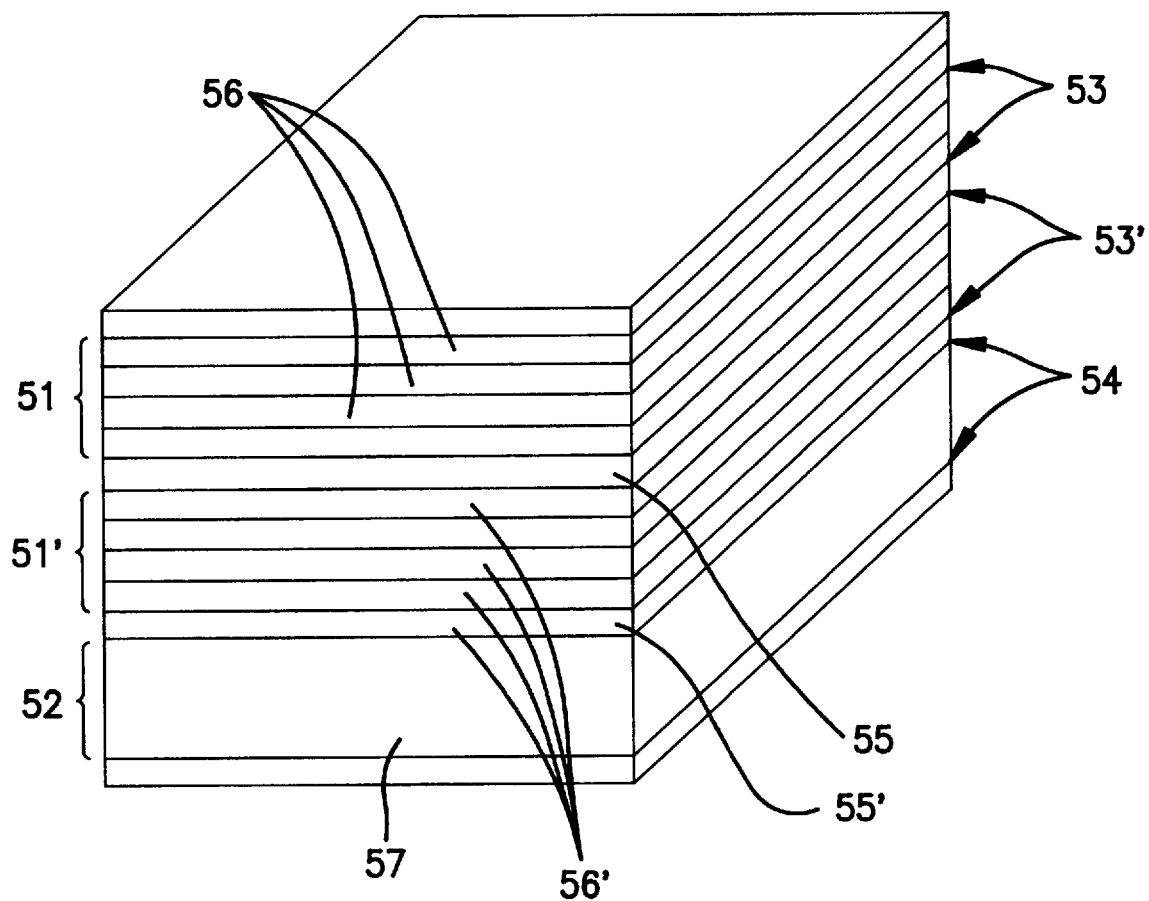
FIG. 1 is a schematic perspective view illustrative of the first conventional piezoelectric ceramic transducer which utilizes a vertical vibration in a thickness direction which is vertical to interfaces of laminated layers.
Figure 2:
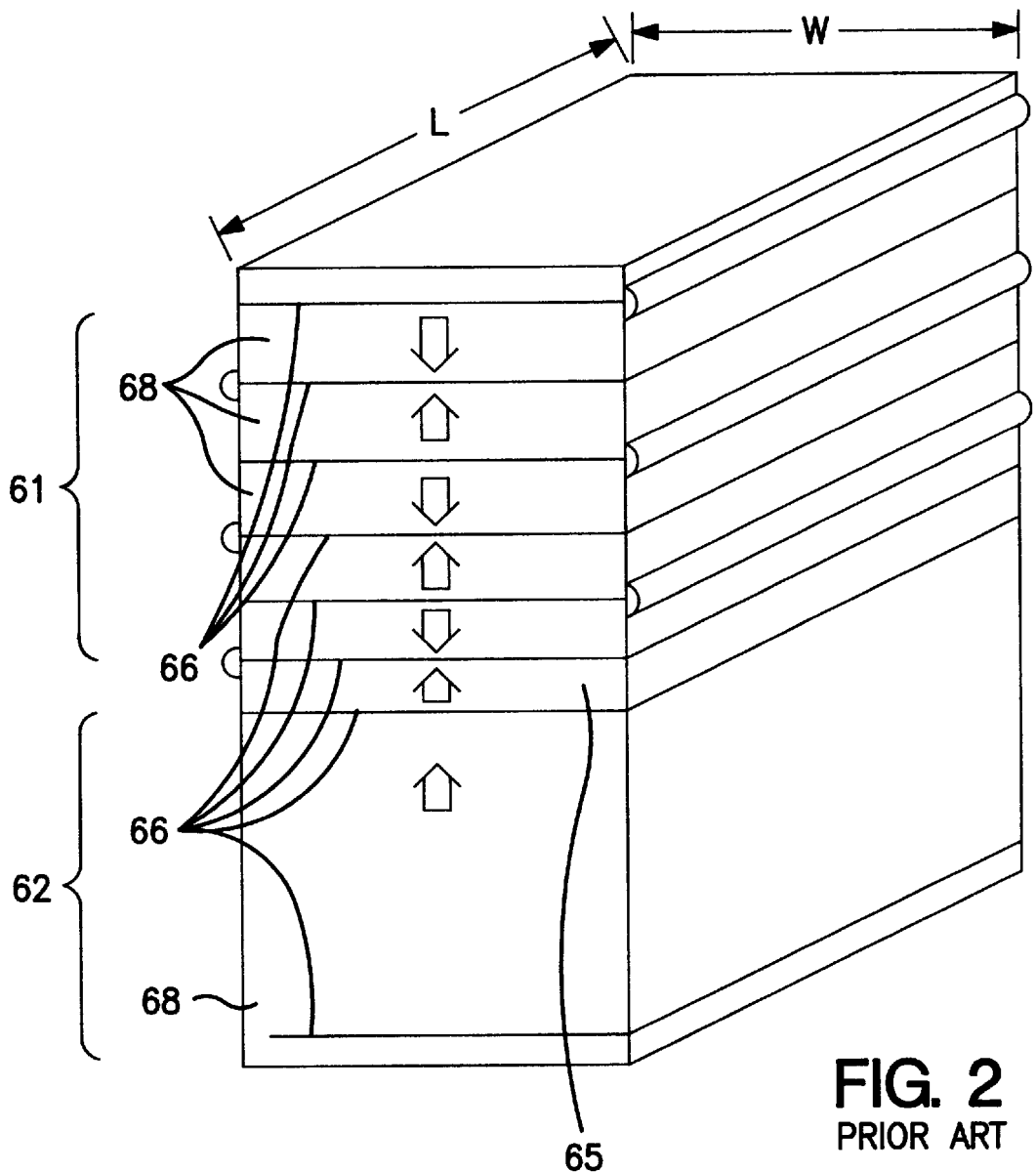
FIG. 2 is a schematic perspective view illustrative of the second conventional piezoelectric ceramic transducer which utilizes a vertical vibration in a thickness direction which is vertical to interfaces of laminated layers.
Figure 3:
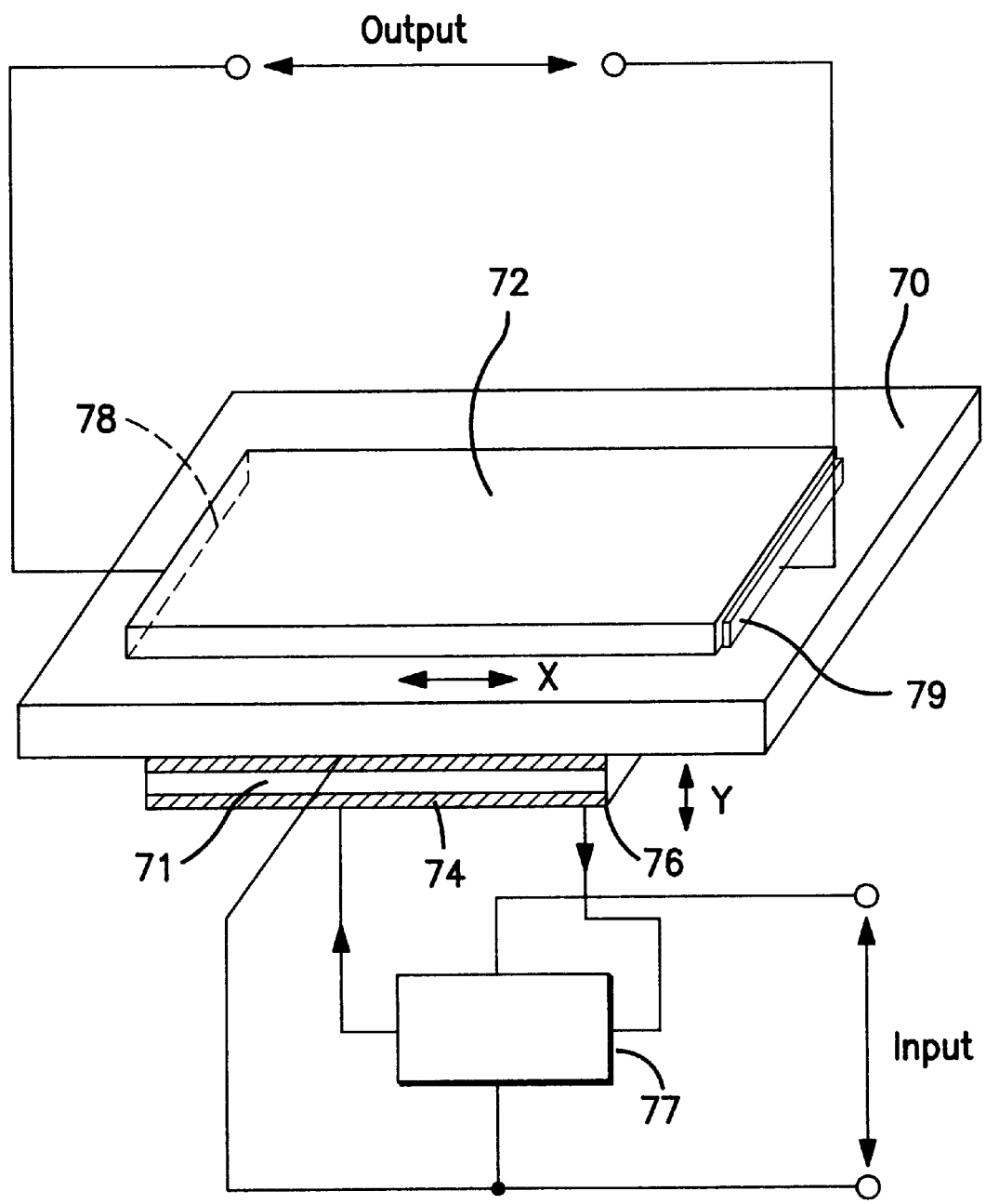
FIG. 3 is a schematic perspective view illustrative of the third conventional piezoelectric ceramic transducer.

The first present invention provides a piezoelectric ceramic transducer having at least a driver section, at least a power generator section and at least an isolator which isolates the driver section and the power generator section, wherein the isolator comprises an internal space as a gap.

The insulation air gap has a high insulating property so that even if the insulation air gap is formed very thin for size reduction of the transducer, then the insulation air gap has a sufficiently high insulating property. Further, the insulation air gap is capable of preventing a transmission of the mechanical vibration whereby the insulation air gap realizes the highly efficient and noise free transducer.

It is available that the air gap is surrounded by ridged rims extending on a peripheral portion between the driver section and the power generator section.

It is also available that the ridged rims are provided on both the peripheral portions of the driver section and the power generator section.

It is also available that the ridged rims are provided on the peripheral portion of the driver section.

It is also available that the ridged rims are provided on the power generator section.

It is also available that the internal space comprises an air-gap.

It is also available that the internal space comprises a gap filled with a gas.

The second present invention provides a method of forming a piezoelectric ceramic transducer comprising the steps of: forming at least a driver section and at least a power generator section separately; providing at least a ridged rim on a peripheral region of at least one of the driver section and the power generator section; and bonding the driver section and the power generator section through the at least the ridged rim thereby to form an air-gap insulator which is surrounded by the ridged rim and defined between the driver section and the power generator section.

The insulation air gap has a high insulating property so that even if the insulation air gap is formed very thin for size reduction of the transducer, then the insulation air gap has a sufficiently high insulating property. Further, the insulation air gap is capable of preventing a transmission of the mechanical vibration whereby the insulation air gap realizes the highly efficient and noise free transducer.

The third present invention provides a method of forming a piezoelectric ceramic transducer comprising the steps of: forming a lamination structure having at least a driver section, at least a power generator section and a combustible material sandwiched between the driver section and the power generator section; and sintering the lamination structure to burn the combustible material whereby an air-gap insulator is formed between the driver section and the power generator section.

The insulation air gap has a high insulating property so that even if the insulation air gap is formed very thin for size reduction of the transducer, then the insulation air gap has a sufficiently high insulating property. Further, the insulation air gap is capable of preventing a transmission of the mechanical vibration whereby the insulation air gap realizes the highly efficient and noise free transducer.

PREFERRED EMBODIMENTS

First Embodiment

Figure 4A:
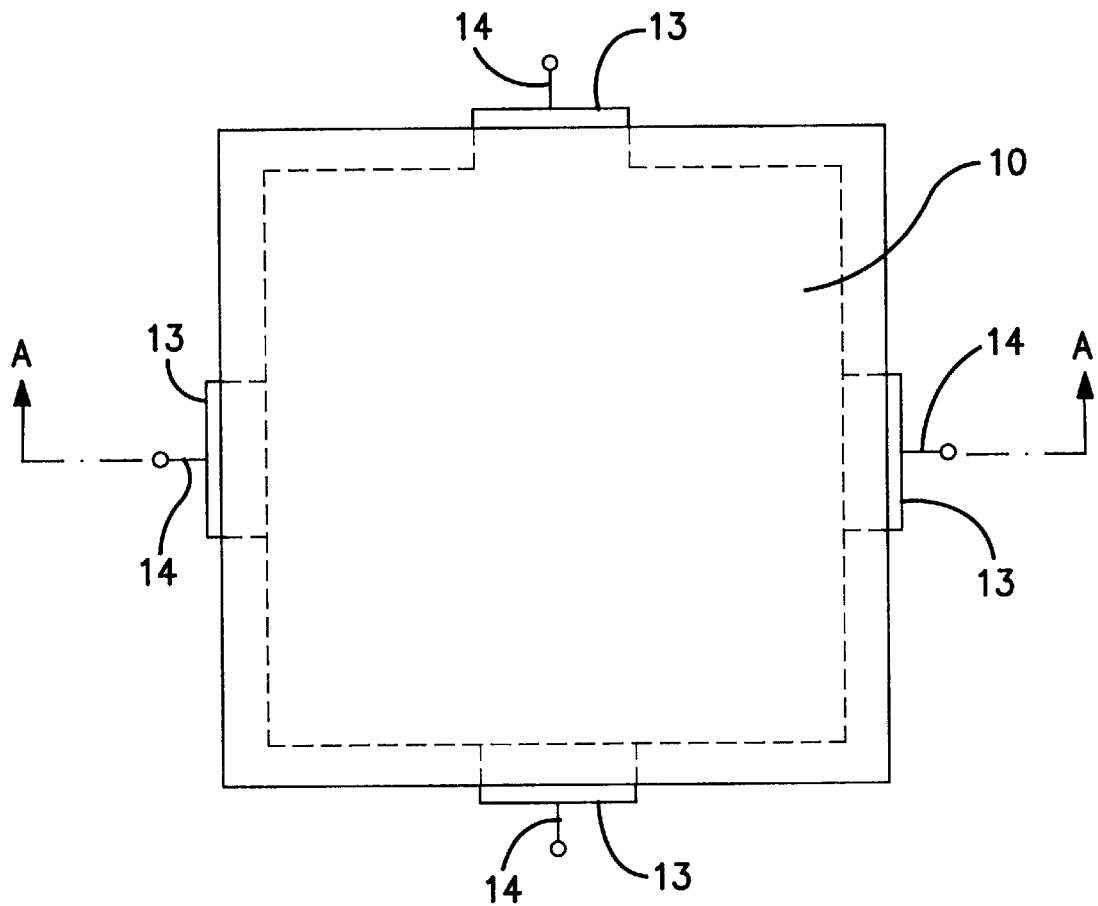
FIG. 4A is a plane view illustrative of a first novel piezoelectric ceramic transducer in a first embodiment in accordance with the present invention.
Figure 4B:
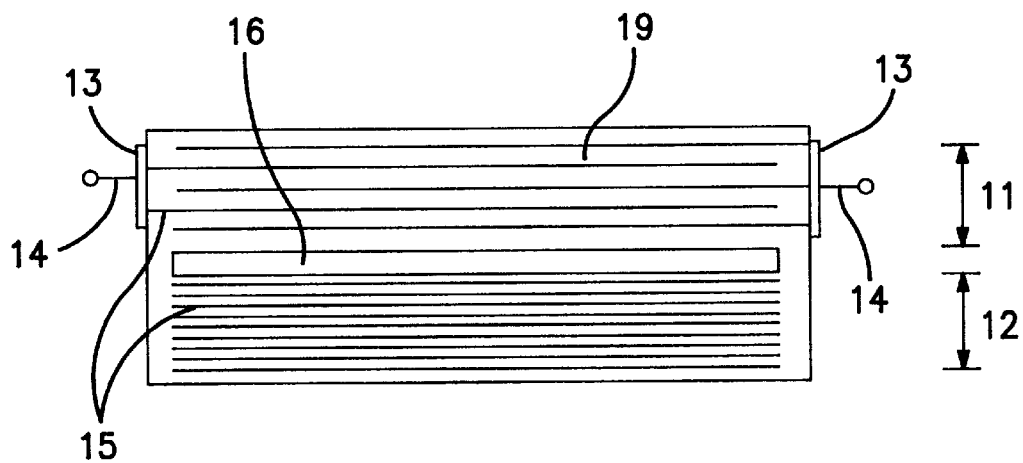
FIG. 4B is a cross sectional elevation view taken along line A—A line of FIG. 4A illustrative of a first novel piezoelectric ceramic transducer in a first embodiment in accordance with the present invention.
Figure 4C:
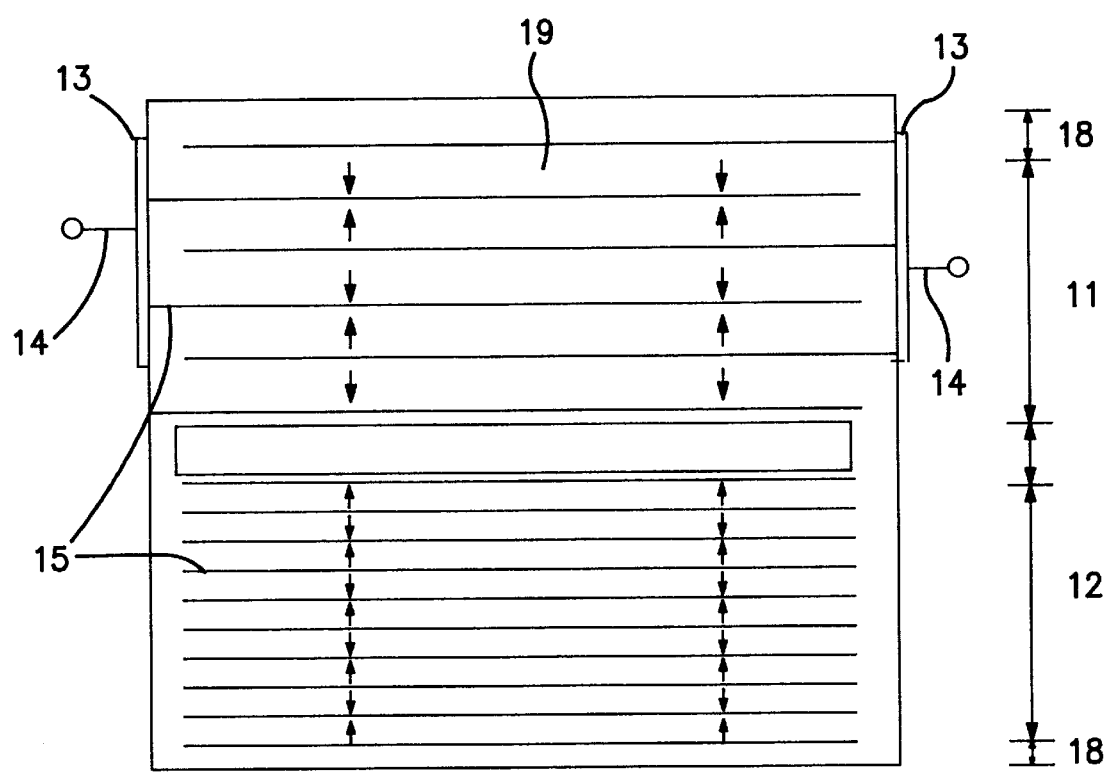
FIG. 4C is a cross sectional elevation view taken along an A—A line of FIG. 4A illustrative of an internal structure of a first novel piezoelectric ceramic transducer in a first embodiment in accordance with the present invention.

A first embodiment according to the present invention will be described in detail with reference to FIGS. 4A, 4B and 4C. FIG. 4A is a plane view illustrative of a first novel piezoelectric ceramic transducer in a first embodiment in accordance with the present invention. FIG. 4B is a cross sectional elevation view taken along an A—A line of FIG. 4A illustrative of a first novel piezoelectric ceramic transducer in a first embodiment in accordance with the present invention. FIG. 4C is a cross sectional elevation view taken along an A—A line of FIG. 4A illustrative of an internal structure of a first novel piezoelectric ceramic transducer in a first embodiment in accordance with the present invention.

The first novel piezoelectric ceramic transducer has a square-shaped piezoelectric ceramic plate 10 which is made of PZT-based ceramic ($PbZrO_3$-$PbTiO_3$). The square-shaped piezoelectric ceramic plate 10 has a size of 20×20 mm and a thickness of 3.3 mm. The first novel piezoelectric ceramic transducer has a driver section 11 and a power generator section 12 which is separated in a thickness direction. The driver section 11 has a lamination structure, wherein adjacent internal electrodes 15 is isolated by each piezoelectric ceramic 19 and the adjacent internal electrodes 15 are polarized in opposite directions to each other. Laminations of the internal electrodes 15 and the piezoelectric ceramics 19 may be formed by the known technique. The driver section 11 has a three-layered structure, whilst the power generator section 12 has a nine-layered structure. First and second external electrodes 13 are provided on side walls of the driver section 11 so that the internal electrodes 15 are alternately connected to the first and second external electrodes 13. The first and second external electrodes 13 are further connected through solders to first and second terminals 14 respectively. The first and second external electrodes 13 may be formed by a screen printing of an Ag paste and subsequent sintering thereof. The internal electrodes 15 extend alternately to the first and second side walls of the driver section 11 so that the internal electrodes 15 are alternately connected to the first and second external electrodes 13. The internal electrode 15 has a size of 18×18 mm.

As a modification to the above, it is possible to use an evaporation or sputtering method.

It is a further possible to use the other conductive materials than Ag.

The driver section 11 and the power generator section 12 are connected to each other in peripheral portions thereof so as to prevent the connections of the internal electrodes 15. An insulating air gap 16 is formed between the driver section 11 and the power generator section 12. The insulating air gap 16 has a size of 16×16 mm and a thickness of 1 mm.

Unpolarized piezoelectric ceramic layers 18 are provided on edges of the driver section 11 and the power generator section 12. The above driver section 11, the power generator section 12, the insulating section 16 and the unpolarized piezoelectric ceramic layers 18 are sintered to be united.

The above first novel piezoelectric ceramic transducer is driven in a vertical vibration mode, wherein a vibration is in a thickness direction of the transducer. A resonance frequency may be presumed to be 2.3 MHz from a frequency characteristic of admittance. A power transmission test is made to confirm that an output power is 2 W and a maximum energy conversion efficiency is 92%.

The above second novel piezoelectric ceramic transducer may be formed by the following first fabrication method. The driver section 21 and the power generator section 22 are separately formed by sintering processes. A selective etching or polishing to the driver section 21 and the power generator section 22 is carried out to form rim-ridged portions on peripheral portions of the driver section 21 and the power generator section 22 so that the rim-ridged portions are projected in the thickness direction. The rim-ridged portions are formed to prevent electrical contact between the internal electrodes 15 of the driver section 21 and the power generator section 22.

As a modification, it is possible that either the driver section 21 or the power generator section 22 is subjected to the selective etching or polishing to form a rim-ridged portion on a peripheral portion of the driver section 21 or the power generator section 22.

The driver section 21 and the power generator section 22 are bonded through the rim-ridged portions thereof, thereby to form the insulation air gap 16 between the driver section 21 and the power generator section 22 thereby completing the second novel piezoelectric ceramic transducer.

Alternately, the above second novel piezoelectric ceramic transducer may be formed by the following second fabrication method. Laminated structures of the transducer is formed by a green sheet ceramic lamination technique which has been used for the laminated ceramic capacitor. Prior to a sintering process, a combustible material such as carbon is filled into the insulation gap between the driver section 21 and the power generator section 22. The laminated structure is sintered whereby the combustible material such as carbon is burned to form the insulation air gap 16 between the driver section 21 and the power generator section 22 thereby completing the second novel piezoelectric ceramic transducer.

The insulation air gap 16 has a high insulating property so that even if the insulation air gap 16 is formed very thin for size reduction of the transducer, then the insulation air gap 16 has a sufficiently high insulating property.

Further, the insulation air gap 16 is capable of preventing a transmission of the mechanical vibration whereby the insulation air gap 16 realizes the highly efficient and noise free transducer.

Second Embodiment

Figure 5A:
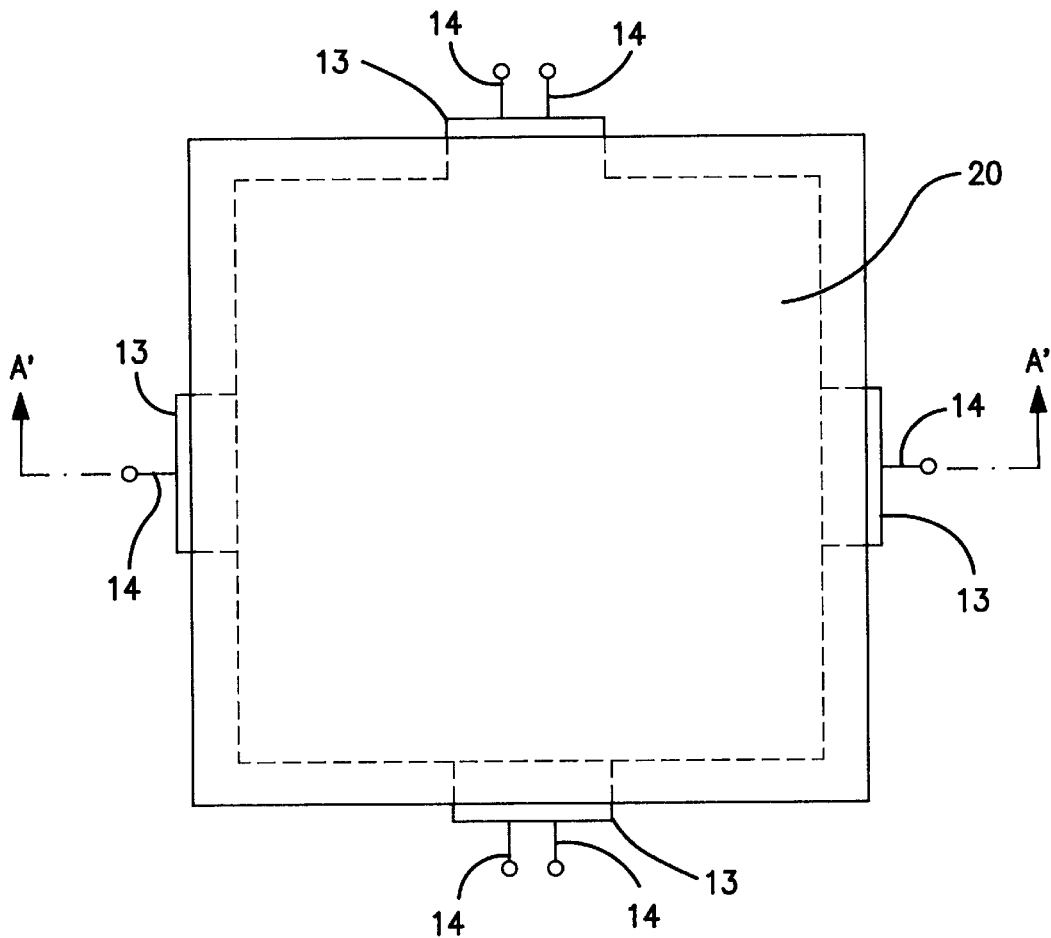
FIG. 5A is a plane view illustrative of a second novel piezoelectric ceramic transducer in a second embodiment in accordance with the present invention.
Figure 5B:
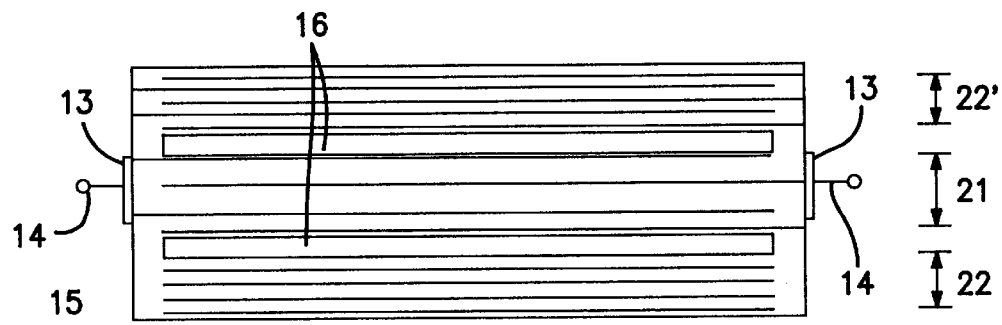
FIG. 5B is a cross sectional elevation view taken along an A—A line of FIG. 5A illustrative of a second novel piezoelectric ceramic transducer in a second embodiment in accordance with the present invention.

A second embodiment according to the present invention will be described in detail with reference to FIGS. 5A, 5B and 5C. FIG. 5A is a plane view illustrative of a second novel piezoelectric ceramic transducer in a second embodiment in accordance with the present invention. FIG. 5B is a cross sectional elevation view taken along an A—A line of FIG. 5A illustrative of a second novel piezoelectric ceramic transducer in a second embodiment in accordance with the present invention.

The second novel piezoelectric ceramic transducer has a square-shaped piezoelectric ceramic plate 20 which is made of PZT-based ceramic ($PbZrO_3$-$PbTiO_3$). A back face of the square-shaped piezoelectric ceramic plate 20 will be referred to as a main face. The second novel piezoelectric ceramic transducer has a driver section 21 and first and second power generator sections 22 and 22' which are separated in a thickness direction so that the driver section 21 is sandwiched by the first and second power generator sections 22 and 22'. The driver section 21 has a lamination structure, wherein adjacent internal electrodes 15 is isolated by each piezoelectric ceramic and the adjacent internal electrodes 15 are polarized in opposite directions to each other. Laminations of the internal electrodes 15 and the piezoelectric ceramics may be formed by the known technique. First and second external electrodes 13 are provided on side walls of the driver section 11 so that the internal electrodes 15 are alternately connected to the first and second external electrodes 13. The first and second external electrodes 13 are further connected through solders to first and second terminals 14 respectively. The first and second external electrodes 13 may be formed by a screen printing of an Ag paste and subsequent sintering thereof. The internal electrodes 15 extend alternately to the first and second side walls of the driver section 21 so that the internal electrodes 15 are alternately connected to the first and second external electrodes 13.

As a modification to the above, it is possible to use an evaporation or sputtering method.

It is a further possible to use the other conductive materials than Ag.

The driver section 21 and the first and second power generator sections 22 and 22' are connected to each other in peripheral portions thereof so as to prevent the connections of the internal electrodes 15. First and second insulating air gaps 16 are formed between the driver section 21 and the first and second power generator sections 22 respectively.

The above insulators may be formed very thin for reduction in size of the transducer.

The above transducer is symmetrical in the thickness direction to prevent an excess vibration mode.

As a furthermore modification, it is possible that a single power generator section is sandwiched by first and second driver sections.

The above second novel piezoelectric ceramic transducer may be formed by the following first fabrication method. The driver section 21 and the power generator section 22 are separately formed by sintering processes. A selective etching or polishing to the driver section 21 and the power generator section 22 is carried out to form rim-ridged portions on peripheral portions of the driver section 21 and the power generator section 22 so that the rim-ridged portions are projected in the thickness direction. The rim-ridged portions are formed to prevent electrical contact between the internal electrodes 15 of the driver section 21 and the power generator section 22.

As a modification, it is possible that either the driver section 21 or the power generator section 22 is subjected to the selective etching or polishing to form a rim-ridged portion on a peripheral portion of the driver section 21 or the power generator section 22.

The driver section 21 and the power generator section 22 are bonded through the rim-ridged portions thereof, thereby to form the insulation air gap 16 between the driver section 21 and the power generator section 22 thereby completing the second novel piezoelectric ceramic transducer.

Alternately, the above second novel piezoelectric ceramic transducer may be formed by the following second fabrication method. Laminated structures of the transducer is formed by a green sheet ceramic lamination technique which has been used for the laminated ceramic capacitor. Prior to a sintering process, a combustible material such as carbon is filled into the insulation gap between the driver section 21 and the power generator section 22. The laminated structure is sintered whereby the combustible material such as carbon is burned to form the insulation air gap 16 between the driver section 21 and the power generator section 22 thereby completing the second novel piezoelectric ceramic transducer.

The insulation air gap 16 has a high insulating property so that even if the insulation air gap 16 is formed very thin for size reduction of the transducer, then the insulation air gap 16 has a sufficiently high insulating property.

Further, the insulation air gap 16 is capable of preventing a transmission of the mechanical vibration whereby the insulation air gap 16 realizes the highly efficient and noise free transducer.

Third Embodiment

Figure 6A:
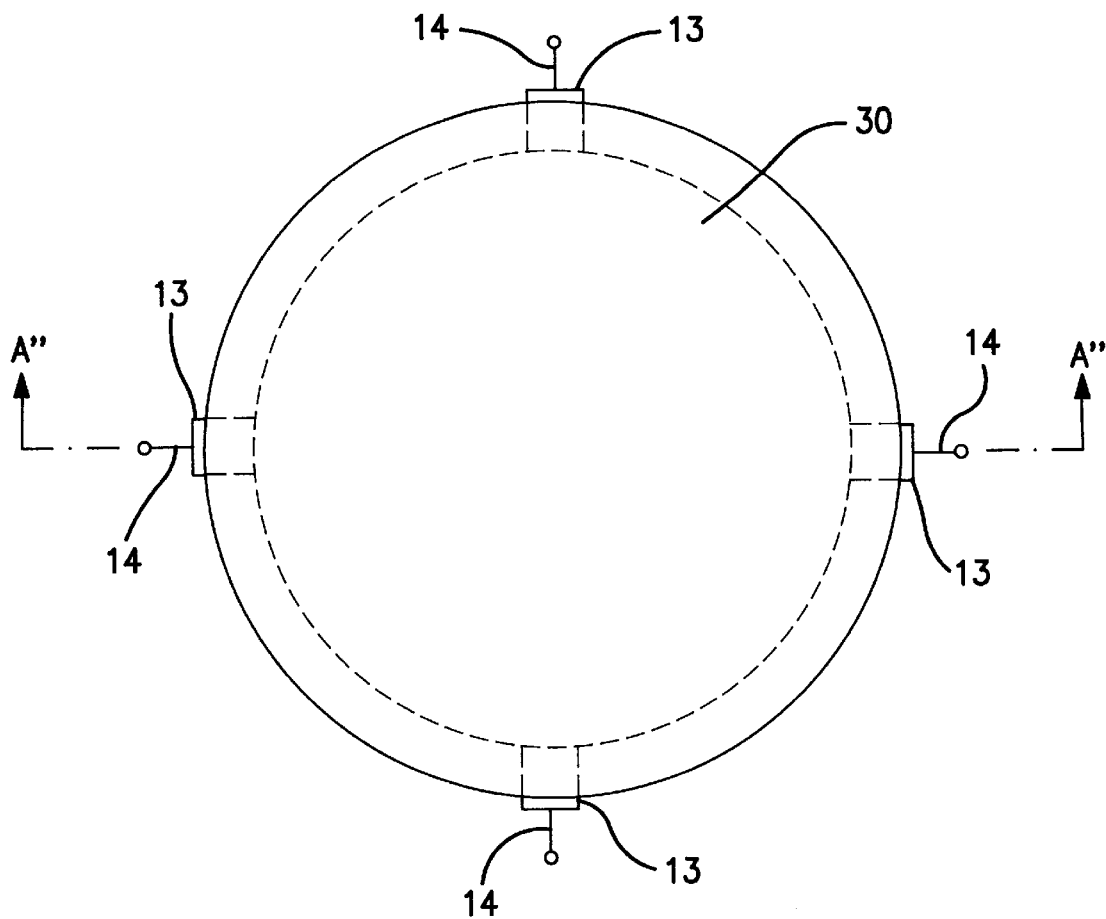
FIG. 6A is a plane view illustrative of a third novel piezoelectric ceramic transducer in a third embodiment in accordance with the present invention.
Figure 6B:
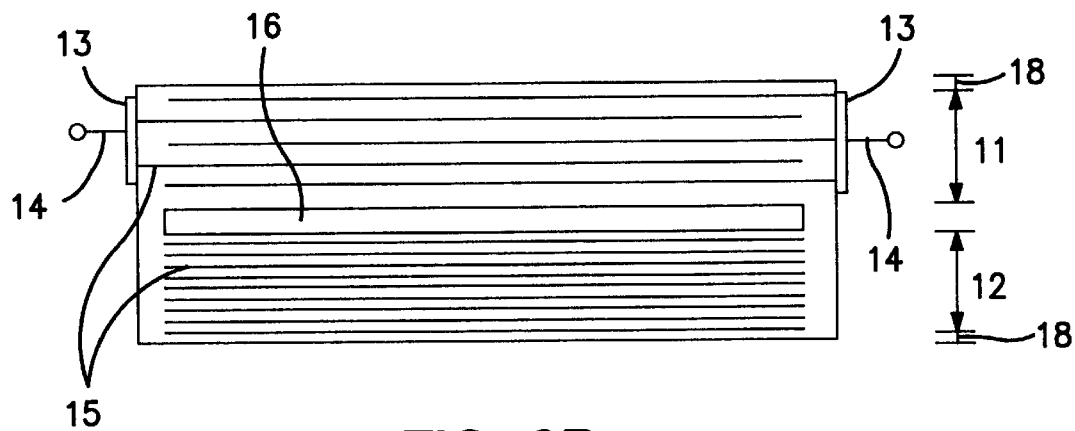
FIG. 6B is a cross sectional elevation view taken along an A—A line of FIG. 6A illustrative of a third novel piezoelectric ceramic transducer in a third embodiment in accordance with the present invention.

A third embodiment according to the present invention will be described in detail with reference to FIGS. 6A, 6B and 6C. FIG. 6A is a plane view illustrative of a third novel piezoelectric ceramic transducer in a third embodiment in accordance with the present invention. FIG. 6B is a cross sectional elevation view taken along an A—A line of FIG. 6A illustrative of a third novel piezoelectric ceramic transducer in a third embodiment in accordance with the present invention.

The third novel piezoelectric ceramic transducer has a circular-shaped piezoelectric ceramic plate 30 which is made of PZT-based ceramic ($PbZrO_3$-$PbTiO_3$). The circular-shaped piezoelectric ceramic plate 30 has a diameter of 30 mm and a thickness of 5 mm. A vibration is transmitted toward a peripheral portion of the circular-shaped piezoelectric ceramic plate 30. The third novel piezoelectric ceramic transducer has a driver section 31 and a power generator section 32 which is separated in a thickness direction. The driver section 31 has a three-layered lamination structure, whilst the power generator section 32 has a twelve-layered lamination structure, wherein adjacent internal electrodes 15 are polarized in opposite directions to each other. Laminations of the internal electrodes 15 and the piezoelectric ceramics may be formed by the known technique. First and second external electrodes 13 are provided on diametrically opposite sides of the driver section 11 so that the internal electrodes 15 are alternately connected to the first and second external electrodes 13. The first and second external electrodes 13 are further connected through solders to first and second terminals 14 respectively. The internal electrodes 15 are provided to have a margin of 2 mm from the edge and the internal electrodes 15 have a diameter of 26 mm. The insulation gap has a diameter of 26 mm and a thickness of 1 mm. The above driver section 31, the power generator section 32 and the insulating section 16 are sintered to be united.

The above third novel piezoelectric ceramic transducer is driven in the above vibration mode, wherein a vibration is transmitted toward the peripheral portions of the transducer. A resonance frequency may be presumed to be 73 KHz from a frequency characteristic of admittance. A power transmission test is made to confirm that an output power is 2 W and a maximum energy conversion efficiency is 92%.

The above third novel piezoelectric ceramic transducer may be formed by the following first fabrication method. The driver section 31 and the power generator section 32 are separately formed by sintering processes. A selective etching or polishing to the driver section 31 and the power generator section 32 is carried out to form rim-ridged portions on peripheral portions of the driver section 31 and the power generator section 32 so that the rim-ridged portions are projected in the thickness direction. The rim-ridged portions are formed to prevent electrical contact between the internal electrodes 15 of the driver section 31 and the power generator section 32.

As a modification, it is possible that either the driver section 31 or the power generator section 32 is subjected to the selective etching or polishing to form a rim-ridged portion on a peripheral portion of the driver section 31 or the power generator section 32.

The driver section 31 and the power generator section 32 are bonded through the rim-ridged portions thereof, thereby to form the insulation air gap 16 between the driver section 31 and the power generator section 32 thereby completing the third novel piezoelectric ceramic transducer.

Alternately, the above third novel piezoelectric ceramic transducer may be formed by the following second fabrication method. Laminated structures of the transducer is formed by a green sheet ceramic lamination technique which has been used for the laminated ceramic capacitor. Prior to a sintering process, a combustible material such as carbon is filled into the insulation gap between the driver section 31 and the power generator section 32. The laminated structure is sintered whereby the combustible material such as carbon is burned to form the insulation air gap 16 between the driver section 31 and the power generator section 32 thereby completing the third novel piezoelectric ceramic transducer.

The insulation air gap 16 has a high insulating property so that even if the insulation air gap 16 is formed very thin for size reduction of the transducer, then the insulation air gap 16 has a sufficiently high insulating property.

Further, the insulation air gap 16 is capable of preventing a transmission of the mechanical vibration whereby the insulation air gap 16 realizes the highly efficient and noise free transducer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A piezoelectric ceramic transducer having at least a driver section, at least a power generator section and at least an isolator which isolates said driver section and said power generator section, wherein said isolator comprises an internal space as a gap.

2. The piezoelectric ceramic transducer as claimed in claim 1, wherein said air gap is surrounded by ridged rims extending on a peripheral portion between the driver section and the power generator section.

3. The piezoelectric ceramic transducer as claimed in claim 2, wherein said ridged rims are provided on both said peripheral portions of said driver section and said power generator section.

4. The piezoelectric ceramic transducer as claimed in claim 2, wherein said ridged rims are provided on said peripheral portion of said driver section.

5. The piezoelectric ceramic transducer as claimed in claim 2, wherein said ridged rims are provided on said power generator section.

6. The piezoelectric ceramic transducer as claimed in claim 2, wherein said internal space comprises an air-gap.

7. The piezoelectric ceramic transducer as claimed in claim 2, wherein said internal space comprises a gap filled with a gas.

* * * * *